(12) United States Patent
Yamaguchi

(10) Patent No.: US 6,514,804 B1
(45) Date of Patent: Feb. 4, 2003

(54) THIN-FILM TRANSISTOR AND FABRICATION METHOD THEREOF

(75) Inventor: Hirotaka Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/574,407

(22) Filed: May 18, 2000

(30) Foreign Application Priority Data

May 20, 1999 (JP) .............................................. 11-140789

(51) Int. Cl.[7] .............................................. H01L 21/84
(52) U.S. Cl. ...................... 438/164; 438/149; 438/688; 438/723
(58) Field of Search ................................. 438/158, 149, 438/151, 164, 688, 706, 707, 719, 723

(56) References Cited

U.S. PATENT DOCUMENTS

| | | | | |
|---|---|---|---|---|
| 4,778,560 A | * | 10/1988 | Takeda et al. | ............... 438/158 |
| 5,892,254 A | * | 4/1999 | Park et al. | ................... 257/295 |
| 6,066,555 A | * | 5/2000 | Nulty et al. | ................. 438/634 |
| 6,190,518 B1 | * | 2/2001 | Phan et al. | ............. 204/192.32 |
| 6,287,944 B1 | * | 9/2001 | Hara et al. | ................... 438/166 |

FOREIGN PATENT DOCUMENTS

| | | |
|---|---|---|
| JP | 62-285464 | 12/1987 |
| JP | 2-85826 | 3/1990 |
| JP | 6-104437 | 4/1994 |
| JP | 7-161660 | 6/1995 |
| JP | 7-333649 | 12/1995 |
| JP | 61-95517 | 5/1996 |
| JP | 8-213621 | 8/1996 |
| JP | 9-160069 | 6/1997 |
| JP | 10-232409 | 9/1998 |
| JP | 11-126777 | 5/1999 |

* cited by examiner

*Primary Examiner*—Kevin M. Picardat
(74) *Attorney, Agent, or Firm*—Scully, Scott, Murphy & Presser

(57) ABSTRACT

A gate-insulating layer, intrinsic amorphous-silicon semiconductor layer, and ohmic contact layer are continuously formed so as to cover a gate electrode on a substrate to remove a natural oxide film from the surface of the ohmic contact layer by performing radio-frequency sputter etching before forming source and drain electrodes. After the natural oxide film is removed, a metallic layer mainly containing Al is formed on the gate-insulating layer and ohmic contact layer.

17 Claims, 6 Drawing Sheets

THIN-FILM TRANSISTOR AND FABRICATION METHOD THEREOF

BACKGROUND OF THE INVENTION

1. Field of the Invention

The present invention relates to a thin-film transistor and its fabrication method, particularly to a method for fabricating an amorphous-silicon thin-film transistor applicable as an active matrix substrate for a liquid-crystal display.

2. Description of the Prior Art

As for a thin-film transistor (hereafter referred to as TFT) using amorphous silicon for an active layer, it is general to form an $N^+$-type amorphous-silicon layer (hereafter referred to as $N^+$a-Si) doped with high-concentration impurities between amorphous silicon (hereafter referred to as a-Si) and source and drain electrodes as an ohmic contact layer. To improve the contact between the ohmic contact layer and the source and drain electrodes, a transition metal such as Cr, Mo or Ti is normally used.

The official gazette of Japanese Patent Laid-Open No. Sho62-285464 published in 1987 discloses a case of using aluminum (Al) alone as a material of source and drain electrodes on an ohmic contact layer of a TFT. However, it is unavoidable that a natural oxide film is formed on the surface of an $N^+$a-Si serving as an ohmic contact layer during fabrication of a TFT. As proposed in the above described official gazette, even if an electrode made of Al alone is formed on an ohmic contact layer with a natural oxide film on its surface, a preferable contact cannot be obtained. However, when a transition metal such as Cr, Mo or Ti is used, a preferable contact is obtained even if a natural oxide film is present on the surface of $N^+$a-Si. Therefore, an electrode made of Al alone is not actually used though it has an advantage of low resistance.

Thus, when using Al alone or a metal mainly containing Al for source and drain electrodes, a large on-current is not obtained due to a natural oxide film on the surface of an ohmic contact layer. A thin-film transistor showing the above described characteristic has a problem that it cannot be used as an active matrix substrate for a liquid-crystal display.

SUMMARY OF THE INVENTION

Therefore, it is an object of the present invention to provide a thin-film transistor using a metal mainly containing Al for source and drain electrodes of an amorphous-silicon TFT so as to be applicable as an active matrix substrate for a liquid-crystal display and its fabrication.

According to the present invention, a gate-insulating layer, a silicon semiconductor layer, and an ohmic contact layer are continuously formed on the entire surface of a transparent insulating substrate so as to cover a gate electrode formed on the substrate to pattern the semiconductor layer and ohmic contact layer in a transistor area like islands. Then, a thin-film-transistor fabrication method is obtained which comprises the steps of performing radio-frequency sputter etching before covering the source and drain electrodes to remove a natural oxide film from the surface of the ohmic contact layer and then, forming a metallic layer mainly containing Al on a gate-insulating layer and the ohmic contact layer.

It is preferable that source and drain electrodes have a double-layer structure configured by an upper layer made of Ti and a lower layer made of Al with an oxide layer formed on the side wall of the structure.

Moreover, it is preferable to use an alloy in which Si is added into Al at a quantity of 0.5 to 3.0 wt % (both included) as a metal mainly containing Al. Furthermore, it is preferable that a silicon semiconductor layer uses an intrinsic a-Si film.

Particularly, according to the present invention, it is preferable to set the time from the step of removing a surface natural oxide film up to start of the step of forming a metallic layer mainly containing Al through sputtering to 1 minute or less.

Moreover, the present invention provides a thin-film transistor fabrication method comprising the steps of forming a gate electrode on a substrate; continuously forming a gate-insulating layer, a semiconductor layer, and an ohmic contact layer on the substrate so as to cover the gate electrode; pattering the semiconductor layer and ohmic contact layer like islands; removing a natural oxide film from the surface of the ohmic contact layer through radio-frequency sputter etching; forming a metallic layer mainly containing aluminum on an ohmic contact layer, an exposed end face of the semiconductor layer, and gate-insulating layer after the step of removing the natural oxide film; and patterning the metallic layer and forming a source electrode and a drain electrode; and further comprising the steps of forming a passivation film so as to cover a thin-film transistor region and a terminal region in which particularly the gate electrode has a double-layer structure configured by a lower-layer metal which is either of a metal mainly containing at least, aluminum and pure aluminum and an upper-layer metal which is a transition metal and the source and drain electrodes have a double-layer structure configured by a lower-layer electrode mainly containing aluminum and an upper-layer electrode made of a transition metal; forming a contact hole for exposing the upper-layer metal to a passivation film on terminal portions of the gate and source electrodes and a passivation film on a region to be connected with a pixel electrode of the drain electrode; and forming a transparent electrode on and around the contact hole to form a gate terminal, a source terminal and a pixel electrode.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
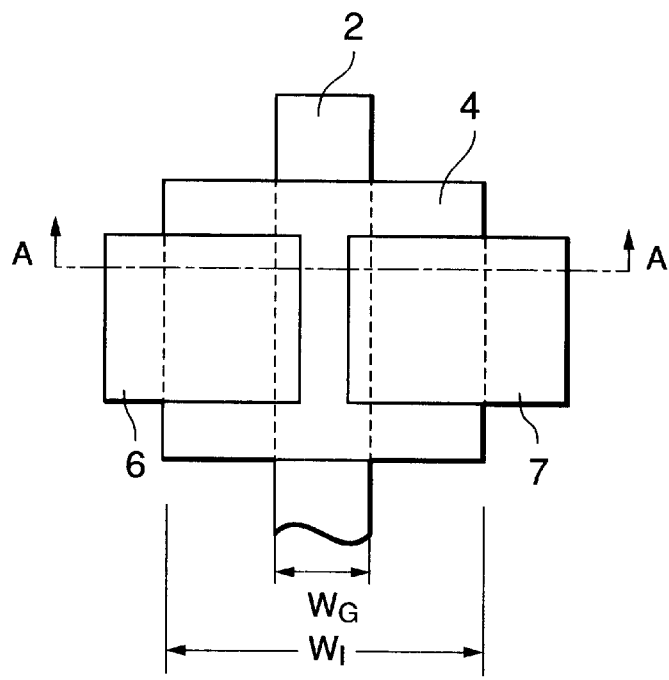
FIG. 1A is a top view of a reverse-staggered thin-film transistor obtained from the present invention.
Figure 1B:
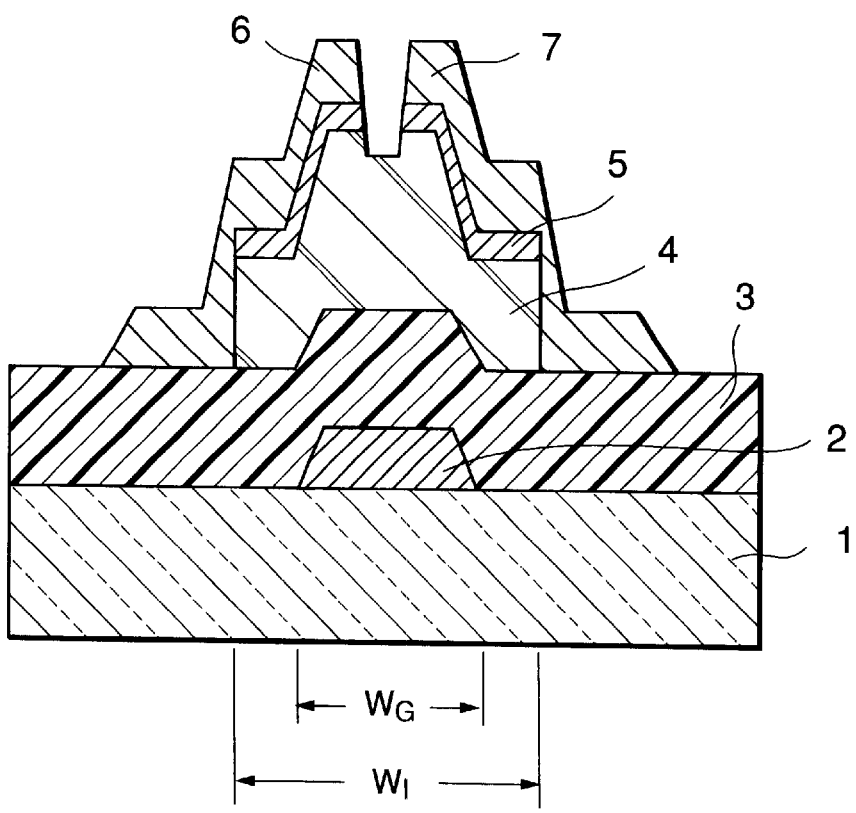
FIG. 1B is an A—A sectional view of FIG. 1A.

As shown in FIGS. 1A and 1B, the reverse-staggered thin-film transistor of an embodiment of the present invention is configured so that a gate electrode width $W_G$ is smaller than an island width $W_1$. Though the reason will be described later, a thin-film transistor fabrication method of the present invention will be described below by referring to FIG. 2A to FIG. 2F.

Figure 2A:
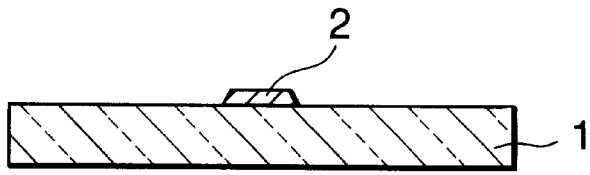
FIGS. 2A to 2F are sectional views showing fabrication steps of the thin-film transistor in FIG. 1.

As shown in FIG. 2A, a gate electrode 2 is formed by depositing Al, Mo or Cr on the surface of a transparent-insulating substrate 1 such as a glass substrate up to a film thickness of 0.1 to 0.4 μm as a gate-electrode metal through, for example, sputtering and patterning the Al, Mo or Cr film through photolithography.

Figure 2B:
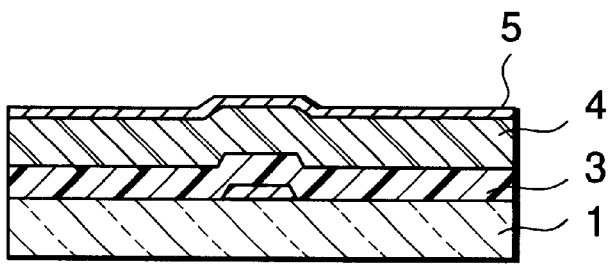

Then, as shown in FIG. 2B, the following are continuously performed on the entire surface of the substrate through plasma CVD so as to cover the gate electrode 2: a silicon nitride film serving as a gate-insulating film 3 is formed at a thickness of 0.2 to 0.6 μm, an intrinsic a-Si film serving as a semiconductor active layer 4 is formed at a thickness of 0.05 to 0.3 μm, and an n+a-Si film serving as an ohmic contact layer 5 is formed at a thickness of 5 to 10 nm.

Figure 2C:
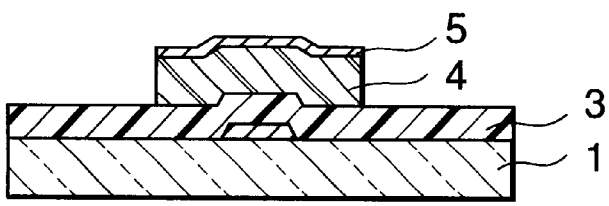

As shown in FIG. 2C, an N+a-Si film and an a-Si film are respectively patterned like an island through photolithography to from an island-shaped ohmic contact layer 5 and an island-shaped intrinsic amorphous-silicon semiconductor layer 4.

In this case, the following are standard as conditions for forming a silicon-nitride film: silane flow rate of approx. 100 sccm, ammonia flow rate of approx. 200 sccm, nitrogen flow rate of approx. 2,000 sccm, film-forming chamber pressure of approx. 120 Pa, radio-frequency power density of approx. 0.1 W/cm$^2$, and substrate temperature of approx. 300° C.

The following are standard as conditions for forming an intrinsic a-Si film: silane flow rate of 250 to 320 sccm, hydrogen flow rate of 700 to 1,000 sccm, film-forming-chamber pressure of 100 to 120 Pa, radio-frequency power density of 0.02 to 0.05 W/cm$^2$, and substrate temperature of 260 to 310° C. The following are standard as conditions for forming an N+a-Si film: silane flow rate of 40 to 70 sccm, hydrogen-based 0.5%-phosphine-mixed gas flow rate of 200 to 350 sccm, film-forming-chamber pressure of 100 to 120 Pa, radio-frequency power density of 0.01 to 0.05 W/cm$^2$, and substrate temperature of 260 to 310° C.

Figure 2D:
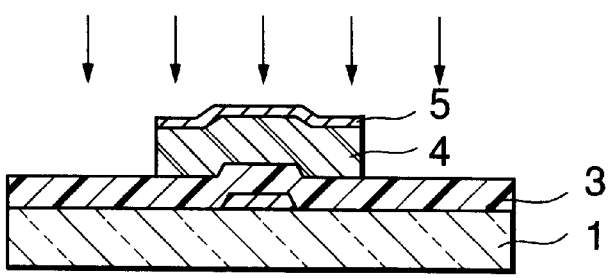

According to this embodiment, the island-shaped ohmic contact layer 5 and intrinsic amorphous-silicon semiconductor layer 4 are patterned and thereafter resist used for photolithography is removed to expose surfaces of these layers 5 and 4 (FIG. 2C). In up to this step, a natural oxide film is formed on the surface of the ohmic contact layer 5 (not illustrated). Then, as shown in FIG. 2D, the natural oxide film is removed from the surface of the ohmic contact layer 5 by applying radio-frequency sputter etching using a non-oxidizing gas such as argon (Ar) or hydrogen (H$_2$) to the surface of a substrate. The radio-frequency sputter etching is performed before forming a metal film mainly containing Al on the gate-insulating layer 3 and ohmic contact layer 5 through sputtering.

Figure 2E:
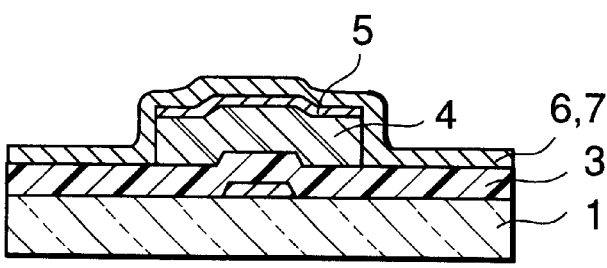

As shown in FIG. 2E, a metal mainly containing Al is continuously deposited on the gate-insulating layer 3 and ohmic contact layer 5 at a film thickness of 0.1 to 0.4 μm through sputtering while keeping a vacuum state. The metal mainly containing Al uses Al containing at least 0.5 wt % of Si such as Al-2 wt % Si.

It is preferable to minimize the time up to start of metal sputtering film formation after end of radio-frequency sputter etching, that is, 1 minute or less is preferable. This is because a vacuum degree in a sputtering system normally ranges between 10$^{-3}$ and 10$^{-5}$ Pa and oxygen is present in the system and therefore, the surface of the ohmic contact layer 5 is oxidized again after a certain time passes and the oxide-film thickness increases.

The sputtering system used for the above described case is the multichamber type in which a radio-frequency sputter etching chamber and a sputter film-forming chamber are connected to each other in a vacuum state in the transfer chamber. Radio-frequency-sputter etching conditions are, for example, charged power density of 0.2 to 1 W/cm$^2$, gas pressure of 0.5 to 2 Pa, and treatment time of 0.5 to 4 minutes. Under the above described conditions, a natural oxide film of 5 and an N+a-Si film respectively having a thickness of 5 to 30 nm are etched.

Figure 2F:
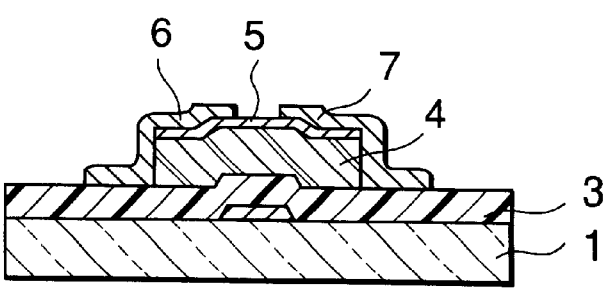

Then, as shown in FIG. 2F, a source electrode 6 and a drain electrode 7 are patterned through photolithography. Then, unnecessary n+-type amorphous silicon layers are removed through etching by using the formed source and drain electrodes as masks. In this case, the intrinsic amorphous-silicon semiconductor layer 4 is also locally over-etched.

Next, to stabilize its characteristics, heat treatment is performed at a temperature between 200 and 280° C., in nitrogen for a period between 0.5 and 2 hours. Thus, a thin film transistor is completed.

As describe later, it is permitted to form a silicon nitride film on the substrate fabricated up to this state at a thickness of 50 to 300 nm as a passivation film 8 through plasma CVD. In this case, to input/output electrical signals to and from the gate electrode and the source and drain electrodes, a contact hole is formed to open a part of the gate electrode and parts of the source and drain electrodes.

Figure 3:
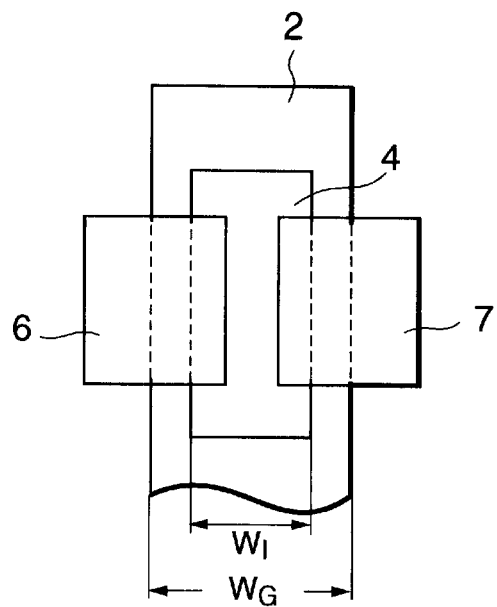
FIG. 3 is a top view of a thin-film transistor when a gate electrode width is larger than an island width.

As for this embodiment, as shown in FIG. 1A, it is better that the gate electrode width is smaller than the island width. This is because it is preferable that a drain current is smaller when a gate voltage is made minus as a transistor characteristic. That is, as shown in FIG. 3, when a gate electrode width is larger than an island width, it is estimated that the following phenomena occur.

The natural oxide film on the surface of the side wall of the intrinsic amorphous-silicon semiconductor layer 4 is also removed through radio-frequency sputter etching, Al directly contacts with the intrinsic amorphous-silicon semiconductor layer 4, and Al diffuses in the intrinsic amorphous-silicon semiconductor layer 4. A portion in which Al diffuses serves as a P-type transistor. A hole current flows through the P-type portion.

Figure 4:
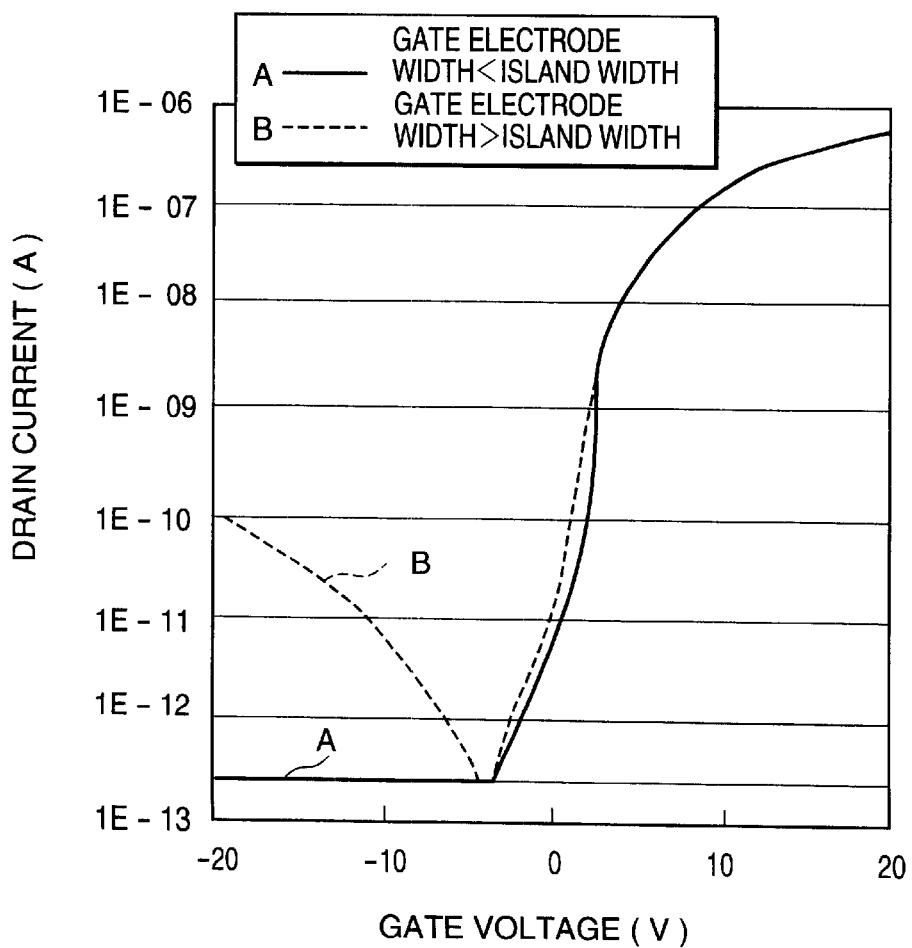
FIG. 4 is a characteristic diagram showing characteristics of gate voltage-drain current in a case (A) in which a gate electrode width is smaller than an island width and a case (B) in which the former is larger than the latter.

FIG. 4 shows gate voltage-drain current characteristics. The following description is based on experimental facts of the characteristics shown in FIG. 4. In these characteristics, the transistor characteristic A shows a characteristic when a gate electrode width is smaller than an island width. Moreover, the transistor characteristic B shows a characteristic when the gate electrode width is larger than the island width.

In FIG. 4 showing the above described relation, a drain current increases by making a gate voltage minus as shown by the characteristic B. However, when the gate electrode width of the characteristic A is smaller than the island width, the hole current does not flow because the gate voltage is not applied up to the P-type portion and thereby, the drain current does not increase even if making the gate voltage minus. Therefore, in this embodiment, the gate electrode width is made smaller than the island width.

Figure 5:
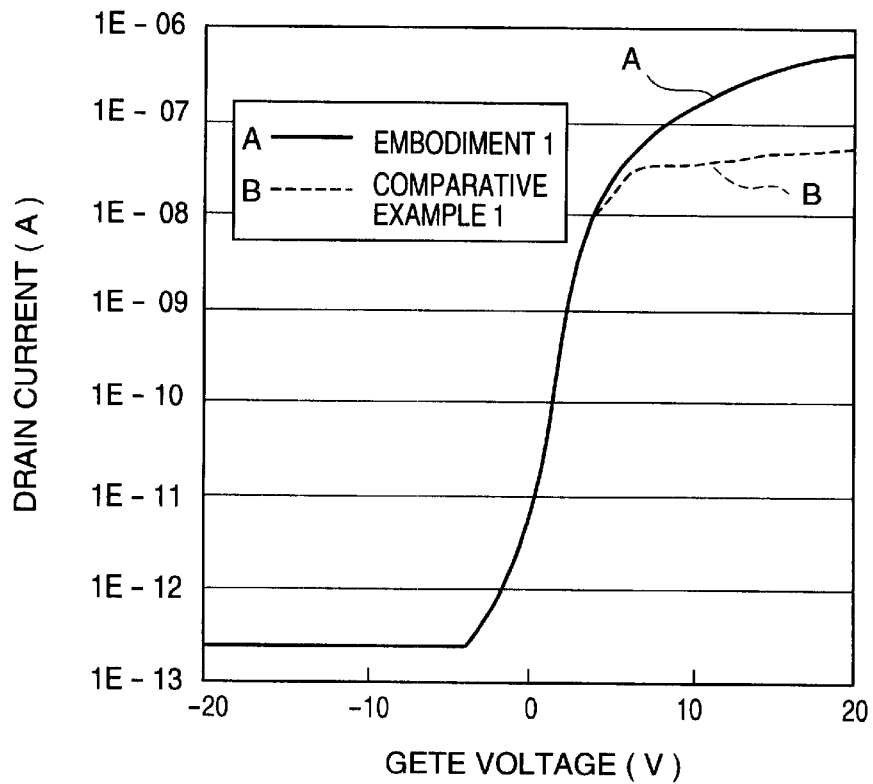
FIG. 5 is a characteristic diagram comparing a transistor characteristic of an embodiment 1 (A) of the present invention with that of a comparative example 1 (B)

To confirm advantages of the above described embodiment, FIG. 5 shows a transistor-characteristic comparative example when assuming a thin-film transistor fabricated in accordance with the above described embodiment except that radio-frequency sputter etching is not performed as a comparative example 1. It is found that the on-current of an embodiment 1 (A) is preferable because it is higher than that of a comparative example 1 (B). In this case, the on-current denotes a drain current when making a gate voltage plus. This is because the contact resistance between an $N^+$-type amorphous-silicon layer and a Al-2 wt %. Si is smaller than that of the comparative example 1.

Figure 6:
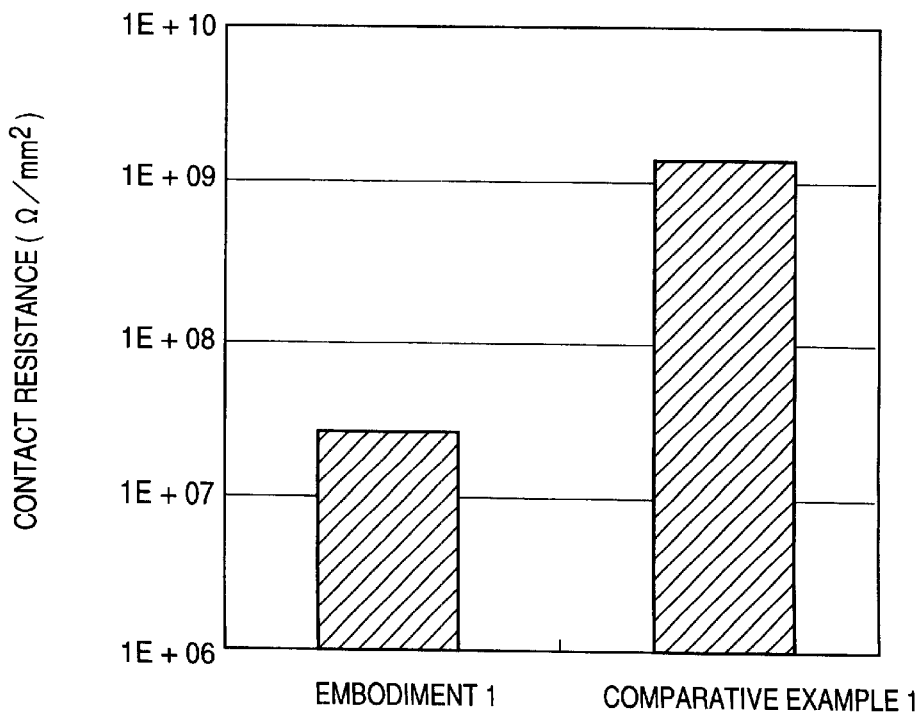
FIG. 6 is a characteristic diagram comparing an embodiment 1 of the present invention with a comparative example 1 about the contact resistance between an ohmic contact layer and source and drain electrodes.

FIG. 6 shows the comparison between contact resistances of the embodiment 1 and comparative example 1. A cause of the difference between the contact resistances is estimated as shown below as described above. As for this embodiment, the surface oxide of an ohmic contact layer is removed through radio-frequency sputter etching. As a result of comparing quantities of silicon oxide and aluminum oxide present at the interface between an oxide ohmic contact layer and source and drain electrodes made of a metal mainly containing Al, it is found that the quantities in the case of this embodiment are greatly smaller than those when radio-frequency sputter etching is not performed (comparative example 1).

Because silicon oxide and aluminum oxide are insulators, a contact resistance increases in the case of the comparative example 1. Also in the case of the present invention, it cannot be said that no oxide is present. The time up to sputter film formation is performed after radio-frequency sputter etching is performed requires at least approx. 30 seconds due to carrying of the substrate. During the above described period, the surface of the ohmic contact layer 5 is slightly oxidized again.

As described above, according to the present invention, because a natural oxide film is removed from the surface of an ohmic contact layer before forming an electrode mainly containing Al, it is possible to obtain preferable transistor characteristics. Moreover, because an electrode having a small resistance can be formed, it is possible to easily apply the present invention to a large liquid-crystal panel.

In the case of the above described embodiment, Al-2 wt % Si is used as a metal for source and drain electrodes. However, it is also permitted to use Al-1 wt % Si. To prevent an eutectic reaction between Al and amorphous-silicon semiconductor, silicon is added to Al. In this case, at least 0.5 wt % of Si is added in order to prevent a reaction between amorphous silicon and Al. When a content of Si is less than 0.5 wt %, it is confirmed through experiments that amorphous silicon reacts with Al and thereby, a transistor does not operate. Moreover, the upper limit of Si quantity to be added is 3 wt %. When a quantity of Si to be added exceeds 3 wt %, an electric resistance increases and there is no advantage of using Al.

An art for adding Si to Al is well known in a crystal-silicon device LSI. As an example applied to an amorphous-silicon TFT like the present invention, the official gazette of Japanese Patent Laid-Open No. Hei6-104437 published in 1994 discloses an example of using an Al gate electrode in order to decrease the electric resistance of a gate-electrode wiring and adding Si in order to prevent a hillock from occurring for Al alone. However, an example of applying Si-added Al to source and drain electrodes on an a-Si-TFT ohmic contact layer is not known.

Figure 7:
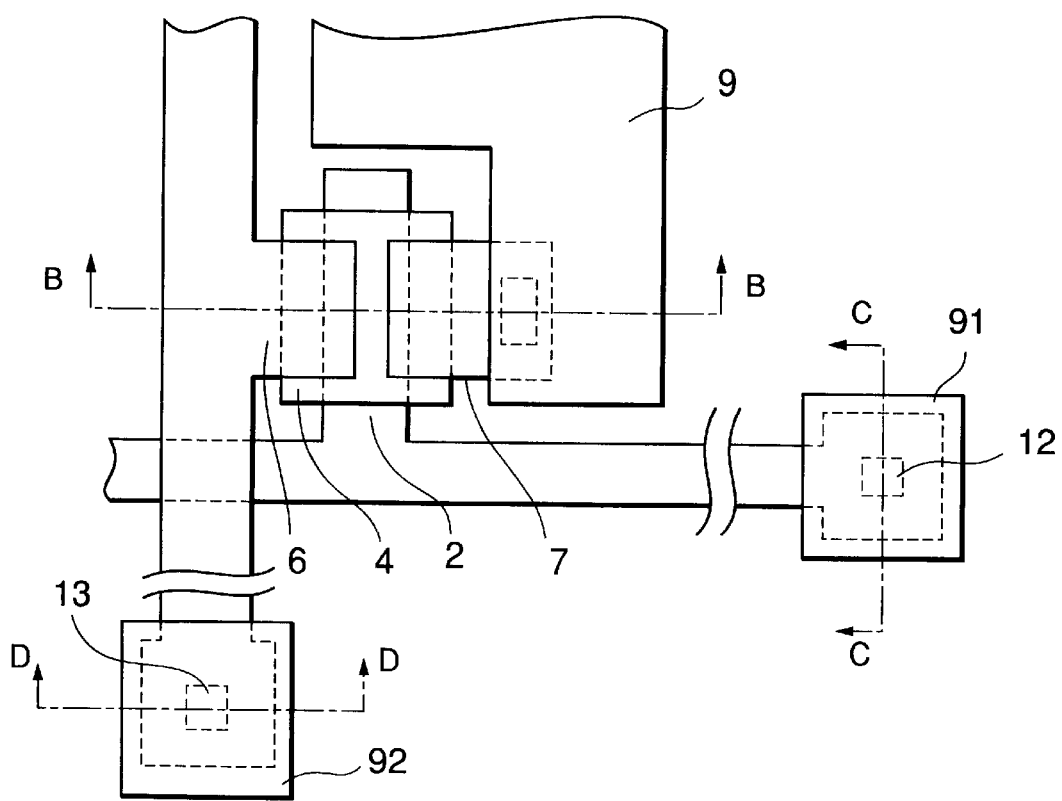
FIG. 7 is a top view showing a thin-film transistor and a terminal portion of another embodiment of the present invention.
Figure 8:
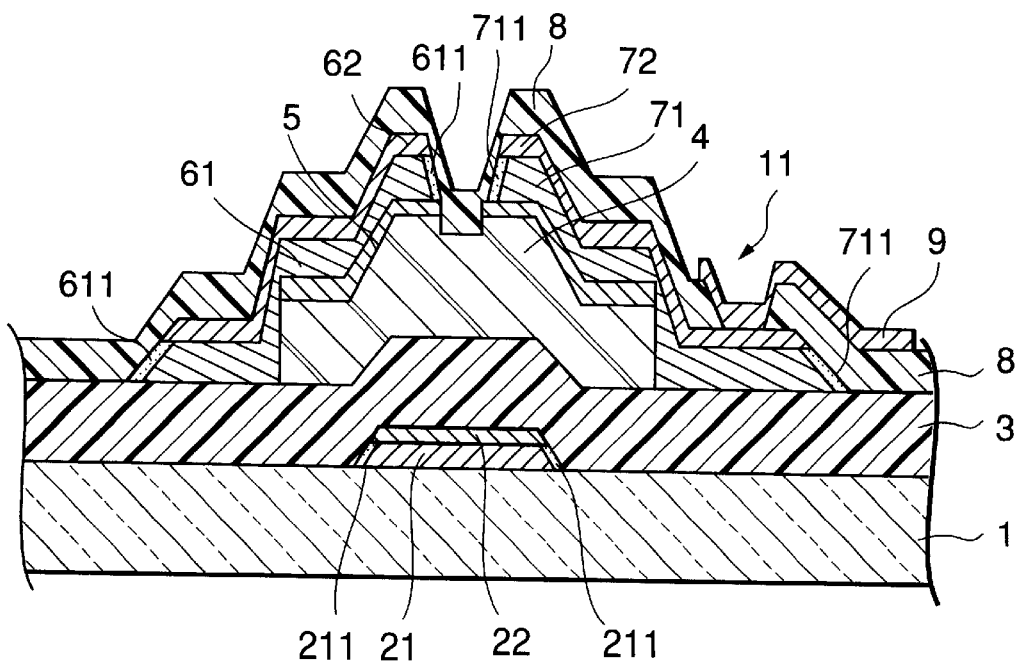
FIG. 8 is a B—B sectional view of FIG. 7, showing a transistor portion.
Figure 9:
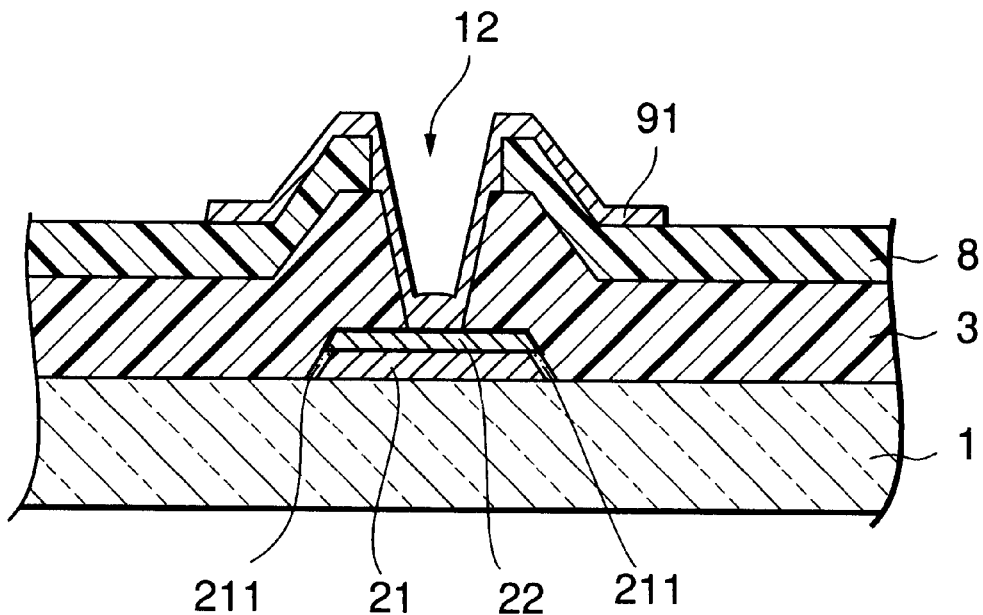
FIG. 9 is a C—C sectional view of FIG. 7, showing a gate terminal portion of a matrix substrate of the present invention.

Then, second embodiment of the present invention will be described below by referring to FIG. 7 through FIG. 9. This embodiment is an example suitable for a case in which a pixel electrode 9 is formed on a passivation film in order to obtain an active matrix substrate of a liquid-crystal display.

Fabrication steps of this embodiment are basically the same as those of the embodiment 1 except that a gate electrode and source and drain electrodes have a double-layer structure. Therefore, detailed illustrations of the fabrication steps are omitted.

First, pure Al or a metal mainly containing Al is deposited on the lower layer of a transparent insulating substrate 1 such as a glass substrate and a transition metal such as titanium (Ti) or chromium is deposited on the upper layer of the substrate 1 as gate electrodes respectively up to a film thickness of 0.05 to 0.4 μm through sputtering or the like. A lower-layer gate electrode 21 and an upper-layer gate electrode 22 are patterned through photolithography. Ti or the like to be deposited on the upper layer of Al of the lower-layer gate electrode 21 is used to improve an electrical contact with a transparent conductive metal-oxide film 10 at a gate terminal portion and a source terminal portion shown in FIG. 9 and FIG. 10.

Because the surface of the side wall of the lower-layer Al is oxidized though the Al side wall of the lower-layer gate electrode 21 is not covered with Ti or the like, a hillock hardly occurs. The surface of the side wall of the lower-layer Al has oxidized layer 211 because oxygen plasma ashing is normally performed to improve the removability of resist and prevent Al from corroding when dry etching is performed. To wet-etch lower-layer Al, it is preferable to perform oxygen plasma ashing in order to prevent a hillock.

Then, the following are continuously performed on the entire surface of a substrate through plasma CVD so as to cover the upper-layer gate electrode 21 and the lower-layer gate electrode 22: a silicon-nitride film serving as a gate-insulating layer 3 is formed at a thickness of 0.2 to 0.6 μm, an intrinsic a-Si film serving as an intrinsic amorphous silicon semiconductor layer 4 is formed at a thickness of 0.05 to 0.3 μm, and an $N^+$a-Si film serving as an ohmic contact layer 5 is formed at a thickness of 5 to 10 nm.

Then, the $N^+$a-Si film and a-Si film are patterned like islands only in a transistor region through photolithography to form an island-shaped ohmic contact layer 5 and intrinsic amorphous-silicon semiconductor layer 4 (refer to FIG. 2C).

In this case, conditions for forming a silicon-nitride film and conditions for forming an intrinsic a-Si film and an $N^+$a-Si film are the same as those described for the embodiment 1.

According to this embodiment, before forming a film of a metal mainly containing Al on the gate-insulating layer 3 and ohmic contact layer 5 through sputtering, radio-frequency sputtering using a non-oxidizing gas such as argon (Ar) or hydrogen ($H_2$) is performed on a substrate formed up to this state. Thereby, a natural oxide film is removed from the surface of the ohmic contact layer 5.

Then, while keeping a vacuum state, a metal mainly. containing Al such as Al-2 wt % Si is continuously deposited on the gate-insulating layer 3 and ohmic contact layer 5 at a film thickness of 0.1 to 0.4 μm through sputtering. Then, while keeping the vacuum state, a transition metal such as titanium (Ti) or chromium is continuously deposited at a film thickness of 0.05 to 0.4 μm through sputtering.

A sputtering system used for the above described case is the multichamber type in which a radio-frequency sputter etching chamber and a sputter film-forming chamber are connected to each other in a vacuum state in the transfer chamber.

A lower-layer source electrode 61, upper-layer source electrode 62, lower-layer drain electrode 71, and upper-layer drain electrode 72 are patterned through photolithography, etching, oxygen plasma ashing (only for dry etching), and resist removal. The surfaces of the side walls of lower-layers 61 and 71 has oxidized layers 611 and 711 similarly to the case of a gate electrode.

Then, unnecessary $N^+$-type amorphous-silicon layers are removed through etching by using the formed source and drain electrodes as masks. The intrinsic amorphous-silicon semiconductor layer 4 is also locally over-etched. This etching is performed by standardly changing a gas containing fluorine or chlorine to plasma. In this case, the side wall of lower-layer Al not covered with Ti may be etched. However, because the side wall is actually oxidized as described above, a film thickness to be etched is small. Therefore, it is effective that the side wall of lower-layer Al is oxidized. To increase the thickness of an oxidized layer on the side wall of lower-layer Al, it is permitted to perform the oxygen plasma treatment again.

Figure 10:
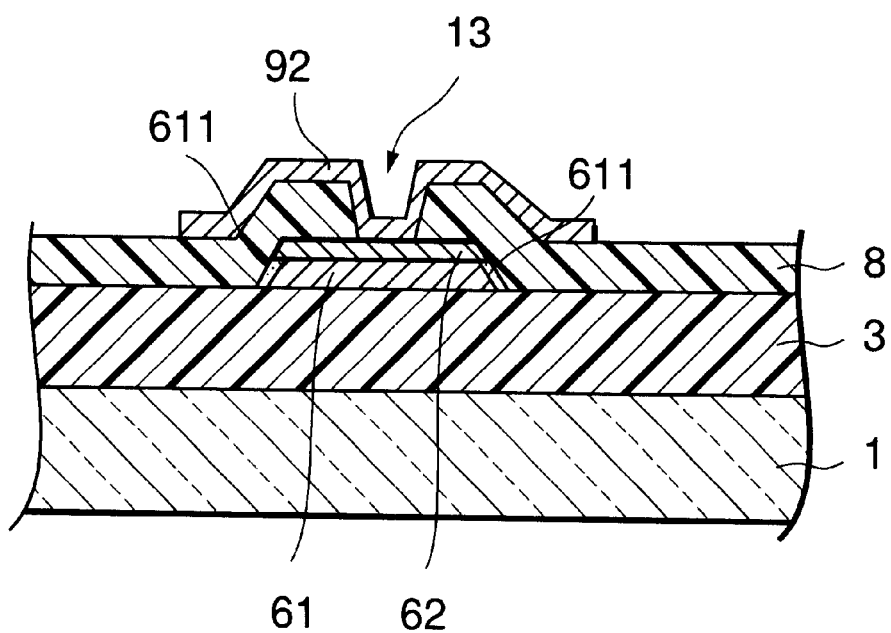
FIG. 10 is a D—D sectional view of FIG. 7, showing a source terminal portion of a matrix substrate of the present invention.

A silicon-nitride film is formed on the substrate fabricated up to this state as a passivation film 8 at a thickness of 50 to 300 nm through plasma CVD. A contact hole 11 is formed on a drain electrode to be connected with a pixel electrode 9 as shown in FIG. 8 through photolithography. In the step of forming the contact hole 11, a contact hole 12 is formed in a region where a gate terminal 91 is formed and a contact hole 13 is formed in a region where a source terminal 92 to be connected to a signal line is formed at the same time as shown in FIG. 9 and FIG. 10.

Then, a transparent conductive metal oxide (e.g. indium tin oxide: ITO) film is formed on the substrate fabricated up to this state through sputtering or the like. The pixel electrode 9, gate terminal 91, and source terminal 92 are patterned through photolithography. The pixel electrode 9, gate terminal 91, and source terminal 92 configured by the same ITO contact with the upper-layer drain electrode 72, upper-layer gate electrode 22, and upper-layer source electrode in a one-to-one correspondence. Because contact resistance between ITO and Ti is low, it is possible to provide a preferable active matrix substrate for a display.

In the case of this embodiment, Ti is provided between Al and ITO to improve the contact characteristic and electrical contact characteristic. In this connection, when making Al directly contact with ITO, the contact resistance is high or becomes higher as time passes. Therefore, the active-matrix substrate for a display has not been used so far as a liquid-crystal active-matrix substrate for a liquid-crystal display.

Then, to stabilize transistor characteristics or improve the in-plane uniformity of transistor characteristics, heat treatment is performed for 0.5 to 2 hours in nitrogen at 200 to 280° C. Thus, an active-matrix substrate for a liquid-crystal display is completed.

Then, third embodiment of the present invention will be described below by referring to FIG. 8 to FIG. 10 again. In the case of this embodiment, the steps of depositing a metal mainly containing Al on a lower layer and a transition metal such as titanium (Ti) or chromium on an upper layer as gate electrodes through sputtering and patterning them are the same as those of the embodiment 2. Thereafter, a gate-insulating film 3, intrinsic amorphous-silicon semiconductor layer 4, and ohmic contact layer 5 are continuously formed in the same manner as the case of the embodiment 2 to pattern an $N^+$a-Si film and a-Si film like islands through photolithography. Conditions for forming each film are the same as the case of the embodiment 2.

Moreover, similarly to the case of the embodiment 2, a natural oxide film is removed from the surface of the ohmic contact layer 5 through radio-frequency sputter etching using a non-oxidizing gas to deposit a metal mainly containing Al (e.g. Al-2 wt % Si) on the gate-insulating layer 3 and ohmic contact layer 5 at a film thickness of 0.1 to 0.4 μm through sputtering. While keeping a vacuum state, a transition metal such as titanium (Ti) or chromium is continuously deposited at a film thickness of 0.05 to 0.4 μm through sputtering.

Though the above described steps are the same as those of the embodiment 2, the following steps are different from those of the embodiment 2. A source electrode 6 and a drain electrode 7 are patterned in the etching step through photo-lithography. In this embodiment 3, unlike in the embodiment 2, the resist used for patterning is not removed but it is used in the additional etching step again. That is, to respectively form sectional forms of source and drain electrodes into a semi-taper, cathode-coupling-type (RIE mode) dry etching is applied. It is preferable to use this type of etching because the next step can be continuously executed in the same system. By continuously executing the next step in the same system, fabrication time can be shortened and corrosion of Al can be prevented.

Continuously, unnecessary $N^+$-type amorphous-silicon layers are removed through etching by using resist-provided source and drain electrodes as masks to form a channel. The intrinsic amorphous-silicon semiconductor layer 4 is also locally over-etched (channel dry etching step). Then, the substrate is exposed to oxygen plasma in the same chamber or carried to another chamber while keeping a vacuum state and exposed to oxygen plasma in the chamber. Because resist is oxygen-ashed, the removability of the resist is improved. Because the side wall of lower-layer Al is oxidized at the same time, the corrosion resistance of the side wall is. improved. The etching surface (generally referred to as back-channel) of the intrinsic amorphous-silicon semiconductor layer is also oxidized.

Accordingly, the insulation characteristic of the back-channel is improved and the back-channel becomes inactive. That is, a leak current does not easily flow when making a gate voltage minus. Thus, a preferable active-matrix substrate for a display is obtained. Oxidizing the substrate by oxygen plasma in the reactive ion etching (RIE) mode is effective compared to the case of the plasma etching (PE) mode because the thickness of an oxide film increases. Moreover, the oxidation is very efficient because operations from the source and drain forming step up to this step can be continuously performed.

Then, resist is removed from the substrate. Thereafter, it is permitted to wash the substrate with ordinary-temperature demineralized water or hot water. This is effective in removing dust and residual etching-gas component.

Because it is hereafter the same as the case of the embodiment 2 to complete an active-matrix substrate for a liquid-crystal display by forming a passivation film 8 and a contact hole and forming and heat-treating an ITO film, the description is omitted.

The surface of the side wall of lower layer Al of the gate electrode is oxidized in the case of the embodiment 3 because oxygen plasma ashing is normally performed to improve the removability of resist and prevent Al from corroding when dry etching is performed. When wet-etching lower-layer Al, it is particularly preferable to perform oxygen plasma treatment.

As described above, a thin-film transistor and its fabrication method of the present invention are characterized by depositing a metal on a transparent insulating substrate as a gate-electrode metal to form a gate electrode, continuously forming a gate-insulating layer, intrinsic amorphous-silicon semiconductor layer, and ohmic contact layer on the entire surface of the substrate so as to cover the gate electrode, applying radio-frequency sputter etching to the surface of the covered substrate and thereby removing a natural oxide film from the surface of the ohmic contact layer, and thereafter forming a metallic layer mainly containing Al on a gate-insulating layer and the ohmic contact layer through sputtering.

According to the above described configuration, because oxide is removed from the surface of the ohmic contact layer through radio-frequency sputter etching, it is possible to decrease a contact resistance.

Because the above described embodiment is one of preferred embodiments of the present invention, specific numerical values and materials of the embodiment are not restricted. It is needless to say that various modifications are allowed as long as the modifications are not deviated from the gist of the present invention.

What is claimed is:

1. A thin-film transistor fabrication method, comprising steps of:
   forming a gate electrode on a substrate;
   continuously forming a gate-insulating layer, a semiconductor layer, and an ohmic contact layer on said substrate so as to cover said gate electrode;
   patterning said semiconductor layer and said ohmic contact layer to form an island;
   removing a natural oxide film from a surface of said ohmic contact layer by using a radio-frequency sputter etching;
   forming a metallic layer mainly containing Al on said ohmic contact layer, an exposed end face of said semiconductor layer, and a gate-insulating layer; and
   patterning said metallic layer to form a source electrode and a drain electrode.

2. The thin-film transistor fabrication method according to claim 1, wherein said semiconductor layer is made of intrinsic amorphous silicon and said ohmic contact layer is made of amorphous silicon doped with an n-type impurity.

3. The thin-film transistor fabrication method according to claim 2, wherein said metallic layer is made of a material which contains 0.5 to 3 wt % of silicon and whose remainder is aluminum.

4. The thin-film transistor fabrication method according to claim 2, wherein said radio-frequency sputter etching is performed by using a non-oxidizing gas.

5. The thin-film transistor fabrication method according to claim 2, wherein time from said step of removing said natural oxide film before start of said step of forming said metallic layer through sputtering is equal to 1 minute or less.

6. The thin-film transistor fabrication method according to claim 2, wherein a width of said gate electrode is smaller than a width of each of said semiconductor layer and ohmic contact layer of said island.

7. The thin-film transistor fabrication method according to claim 1, wherein said gate electrode has a double-layer structure configured by a lower-layer metal which is a metal mainly containing at least Al or pure aluminum and an upper-layer metal which is a transition metal.

8. The thin-film transistor fabrication method according to claim 1, wherein said metallic layer has a double-layer structure configured by a lower-layer metal which is a metal mainly containing aluminum and an upper-layer metal which is a transition metal and said source and drain electrodes are patterned so as to have a double-layer structure.

9. The thin-film transistor fabrication method according to claim 8, wherein an oxide layer is formed on a side wall of a lower-layer metal configuring said source and drain electrodes.

10. The thin-film transistor fabrication method according to claim 9, wherein said oxide layer is formed by using an oxygen-plasma ashing step.

11. The thin-film transistor fabrication method according to claim 1, wherein said gate electrode is configured by a metal selected from one of Al, Mo and Cr, said semiconductor layer comprises an intrinsic amorphous-silicon semiconductor layer, said ohmic contact layer comprises amorphous silicon doped with an n-type impurity, and said source and drain electrodes are configured by aluminum containing 0.5 to 3 wt % of silicon.

12. The thin-film transistor fabrication method according to claim 1, wherein following steps are included: a step of forming a passivation film so as to cover a thin-film transistor region and terminal region in which said gate electrode has a double-layer structure configured by a lower-layer metal which is either of a metal mainly containing Al and pure aluminum and an upper-layer metal which is a transition metal and said source and drain electrodes have a double-layer structure configured by a lower-layer electrode mainly containing aluminum and an upper-layer electrode made of a transition metal, a step of forming a contact hole for exposing an upper-layer metal on said passivation film on terminal portions of said gate and source electrodes and said passivation film on a region to be connected with a pixel electrode of said drain electrode, and a step of forming a transparent electrode on and around said contact hole and forming a gate terminal, a source terminal, and a pixel electrode.

13. The thin-film transistor fabrication method according to claim 1, wherein said gate electrode has a double-layer structure configured by a lower-layer metal mainly containing at least Al and an upper-layer metal which is a transition metal, said source and drain electrodes have a double-layer structure configured by a lower-layer electrode mainly containing aluminum and an upper-layer electrode made of a transition metal, and a resist used for patterning said source and drain electrodes is not removed but it is continuously used as etching resist for respectively forming sectional forms of said source and drain electrodes into a semi-taper.

14. A thin-film transistor obtained from a fabrication method of claim 1, wherein said gate electrode, said source electrode, and said drain electrode respectively have a double-layer structure configured by a lower-layer electrode mainly containing aluminum and an upper-layer electrode made of a transition metal and an aluminum oxide film is formed on an end face of said lower-layer electrode.

15. The thin-film transistor according to claim 14, wherein said lower-layer electrode is made of aluminum containing 0.5 to 3 wt % of aluminum and said upper-layer electrode is made of either of metals Ti and Cr.

16. The thin-film transistor according to claim 15, wherein said semiconductor layer is an intrinsic amorphous-silicon semiconductor layer and said ohmic contact layer is an amorphous silicon layer doped with an n-type impurity.

17. The thin-film transistor according to claim 14, wherein a width of said gate electrode is smaller than a width of each of said semiconductor layer and ohmic contact layer of said island.

* * * * *